United States Patent [19]

Kish, Jr. et al.

[11] Patent Number: 5,724,376
[45] Date of Patent: Mar. 3, 1998

[54] TRANSPARENT SUBSTRATE VERTICAL CAVITY SURFACE EMITTING LASERS FABRICATED BY SEMICONDUCTOR WAFER BONDING

[75] Inventors: Fred A. Kish, Jr., San Jose; Richard P. Schneider, Jr., Mountain View, both of Calif.

[73] Assignee: Hewlett-Packard Company, Palo Alto, Calif.

[21] Appl. No.: 565,537
[22] Filed: Nov. 30, 1995
[51] Int. Cl.[6] .................................................. H01S 3/19
[52] U.S. Cl. .......................... 372/96; 372/36; 372/46
[58] Field of Search ........................... 372/96, 92, 50, 372/45, 46, 36

[56] References Cited

U.S. PATENT DOCUMENTS

5,376,580  12/1994  Kish et al. ...................... 437/127
5,491,712  2/1996  Lin et al. ........................ 372/50
5,502,316  3/1996  Kish et al. ...................... 372/46
5,606,572  2/1997  Swirhun et al. ................ 372/50

*Primary Examiner*—James W. Davie
*Attorney, Agent, or Firm*—Jonathan B. Penn

[57] ABSTRACT

A method for fabricating transparent substrate vertical cavity surface emitting lasers ("VCSEL"s) using wafer bonding is described. The VCSELs have their active layers located much more closely to a heat sink than is possible in known absorbing substrate VCSELs. The improved heat transport from the active layer to the heat sink permits higher current operation with increased light output as a result of the lower thermal impedance of the system. Alternatively, the same light output can be obtained from the wafer bonded VCSEL at lower drive currents. Additional embodiments use wafer bonding to improve current crowding, current and/or optical confinement in a VCSEL and to integrate additional optoelectronic devices with the VCSEL.

16 Claims, 7 Drawing Sheets

TRANSPARENT SUBSTRATE VERTICAL CAVITY SURFACE EMITTING LASERS FABRICATED BY SEMICONDUCTOR WAFER BONDING

BACKGROUND OF THE INVENTION

This invention is in the field of light emitting semiconductor devices. It relates particularly to the fabrication of vertical cavity surface emitting lasers ("VCSEL"s) using semiconductor wafer bonding techniques. These techniques result in VCSELs with low thermal resistance and/or improved current/optical confinement.

A standard VCSEL is formed by placing a p-n junction with a light emitting active region between two high reflectivity mirrors. The mirrors are commonly formed from stacks of alternating high and low refractive index materials, each having an optical thickness corresponding to an odd integer multiple of ¼ of the emission wavelength of the active region. These stacks are usually composed of semiconductor alloys but may also consist of dielectric insulators, reflective metals, or any combination of these materials. Typically, the semiconductor mirror stack is adjacent to the active layer for reasons of flexibility in device design and reliability.

Semiconductor wafer bonding is known in the art and is used to fabricate optoelectronic devices. It has been used to fabricate light emitting diodes with improved light extraction properties (see Kish et al., U.S. Pat. No. 5,376,580). Wafer bonding has also been used to fabricate one type of VCSEL device wherein high reflectivity mirror stacks are wafer bonded to a light emitting active layer(see J. J. Dudley et al., "Low Threshold Wafer Fused Long Wavelength Vertical Cavity Lasers", Appl. Phys. Lett. 64, pp. 1463–5, 21 March 1994). This technique is preferred when growing a lattice matched, high quality mirror and active layer structure is difficult due to the low refractive index contrast present in such material systems as InP, InGaAsP, InAlGaAs.

Figure 1:
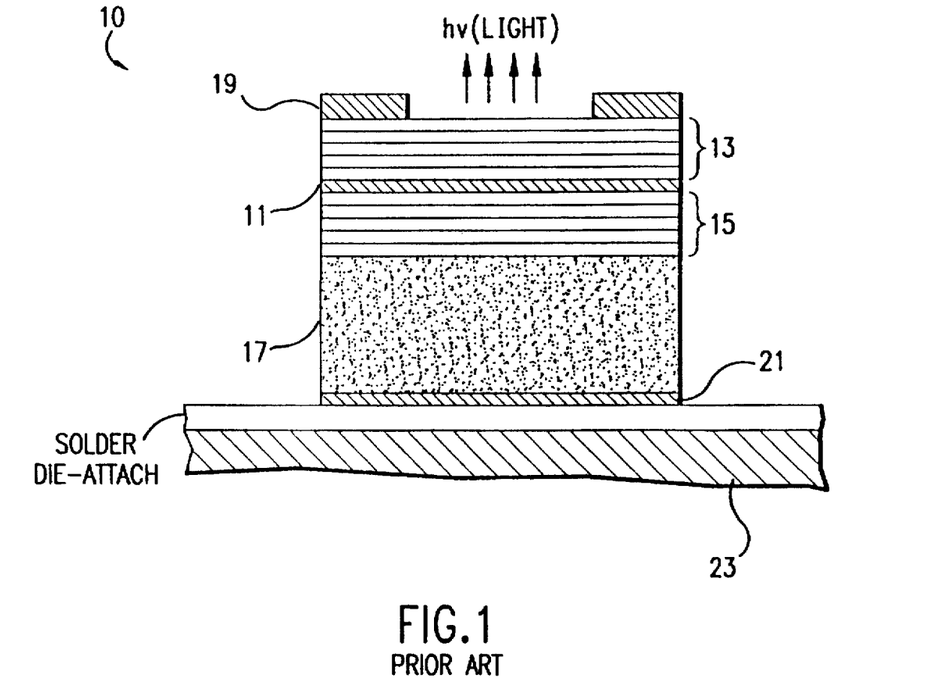

A known VCSEL with an absorbing substrate ("AS") is shown in FIG. 1. VCSEL 10 consists of active layer 11, the active layer having at least a first p-n junction with one or more quantum wells and being less than 2 µm in total thickness, upper and lower distributed Bragg reflectors ("DBR"s) 13 and 15, each DBR being about 2–5 µm thick and partially transparent to the wavelength of light generated by active layer 11, and AS 17, which is at least 100 µm thick. The DBRs further comprise a plurality of thin layers, each layer having a different doping type. A ring contact metallization 19 and a lower contact metallization 21 allow current to flow through the VCSEL. The lower contact metallization is in turn die attached to a metal heat sink 23. Light exits the VCSEL primarily through upper DBR 13. Some form of current confinement, using implantation, reverse biased p-n junction blocking layers, or another known method, is generally used above and/or below the active layer to confine the carriers injected into the active layer within the area defined by ring contact 19.

VCSELs tend to generate a large amount of internal heat due to the relatively high series resistance imposed by the DBRs, as well as the higher current densities and small active volumes within the device. The AS compounds this problem, as the active layer must be mounted "up", meaning away from the heat sink, to allow light to escape from the device. This results in the active layer being more than 100 µm away from the heat sink. Given the lengthy distance to the heat sink, heat is conducted out of the VCSEL less efficiently, resulting in an active layer which operates at a higher temperature. This reduces the VCSEL's overall efficiency and limits the user's ability to drive the VCSEL with a higher drive current, which would provide increased power output.

Improving the thermal resistance of VCSELs would improve their performance and would therefore be highly desirable.

SUMMARY OF THE DISCLOSURE

The present invention describes methods for using wafer bonding to substitute an AS with a TS to create a VCSEL with lower thermal resistance and higher efficiency. The wafer bonding techniques may also be used to improve the VCSEL's current and optical confinement, which also leads to better performance.

A first embodiment of the present invention comprises devices and methods for fabricating a VCSEL using wafer bonding to replace an AS with a TS. The TS VCSEL has its active layer closer to the heat sink, resulting in better thermal performance and thus better efficiency. This embodiment may also facilitate integrating the VCSEL with other optoelectronic components.

A second embodiment of the present invention comprises devices and methods for fabricating VCSELs using wafer bonding wherein patterned current and/or optical confinement regions are in close proximity with the wafer bond interface and the active layer. The resulting devices exhibit improved performance compared to known VCSELs in areas which may include threshold current, threshold voltage, single-mode stability, efficiency, and output power.

The present invention will now be described in detail, with reference to the figures listed and described below.

BRIEF DESCRIPTION OF THE ILLUSTRATIONS

FIG. 1 is a cross sectional view of a known VCSEL with an AS;

DETAILED DESCRIPTION OF THE PREFERRED EMBODIMENT

Wafer bonding is a relatively mature technology when used with Si and $SiO_2$. Its use has recently been extended to compound semiconductors. In this area, applications include wafer bonding "thick" transparent windows to light emitting diode ("LED") structures, permitting greater light extraction from the LED, and wafer bonding high refractive index contrast DBRs to long wavelength VCSELs.

Thermal conduction within known VCSELs can be improved by using compound semiconductor wafer bonding to replace an AS with a TS. If a TS is used, the VCSEL can be mounted on a heat sink with its active layer less than 5 µm from the heat sink ("junction down"), which greatly improves the thermal resistance of the mounted device. A theoretical 2- to 5-fold increase in total light output may be possible in the resulting devices or, alternatively, the VCSEL can be operated at a lower drive current and still provide the same total light output (higher efficiency operation).

Figure 2:
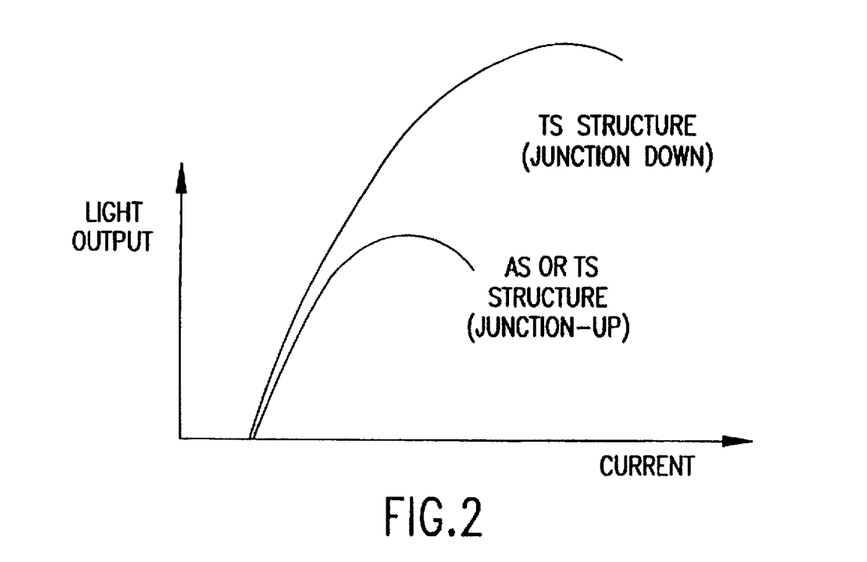
FIG. 2 is a graph showing the current/light output relationship for an AS or TS VCSEL mounted "junction up" and a TS VCSEL mounted "junction down"

FIG. 2 is a graph of the relative performance of an AS or TS VCSEL mounted "junction up" and a TS VCSEL mounted "junction down". As the graph makes clear, above a certain drive current, the AS VCSEL's light output decreases. At the same and somewhat higher drive currents, the TS VCSEL's light output continues to increase. This improved behavior is facilitated by the ability of a TS device mounted "junction down" to dissipate heat generated within the device. The heating of the device results from power which is dissipated non-radiatively into heat in the active layer or that occurs from joule heating within the device. The later effect is very significant in VCSEL devices as a result of the high series resistance in mirror stacks and contact layers. The large amount of heat generated in the VCSEL is responsible for the decrease in light output observed at higher currents in the VCSEL of FIG. 2. This effect is much more severe in AlGaAs/GaAs (<850 nm) and AlGaInP/GaAs (<690 nm) VCSELs wherein carrier leakage across the active layer increases substantially with increasing temperature. The TS VCSEL can be mounted "junction down" with the active layer and DBRs in close proximity (<10 µm) to a high thermal conductivity heat sink, allowing heat to be removed from the device more efficiently. The improved thermal performance may facilitate an increased range of single mode operation (for longitudinal and/or transverse modes) as a result of minimizing the changes in refractive index and gain profile caused by heating within the device.

Figure 3A:
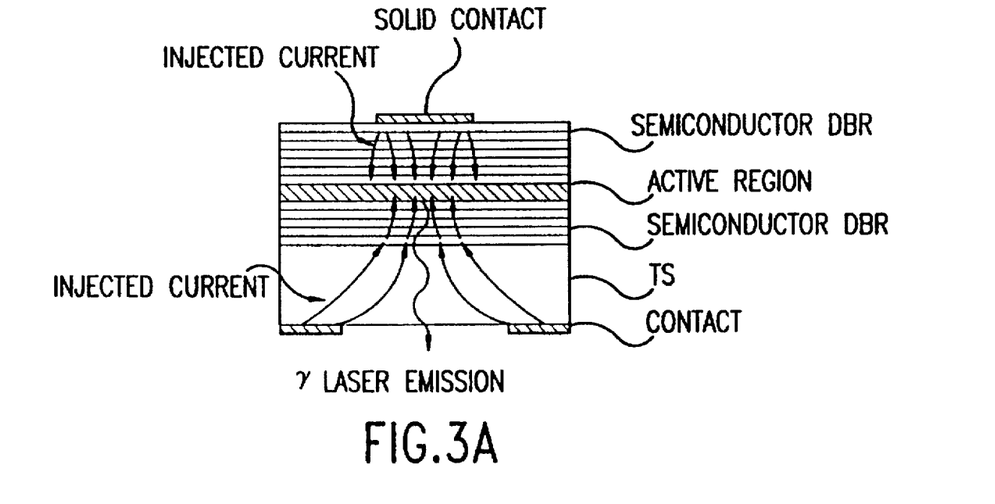
FIG. 3 illustrates the solid geometry contact that can be used in a TS VCSEL (a) compared to the annular geometry contact required in an AS VCSEL(b)
Figure 3B:
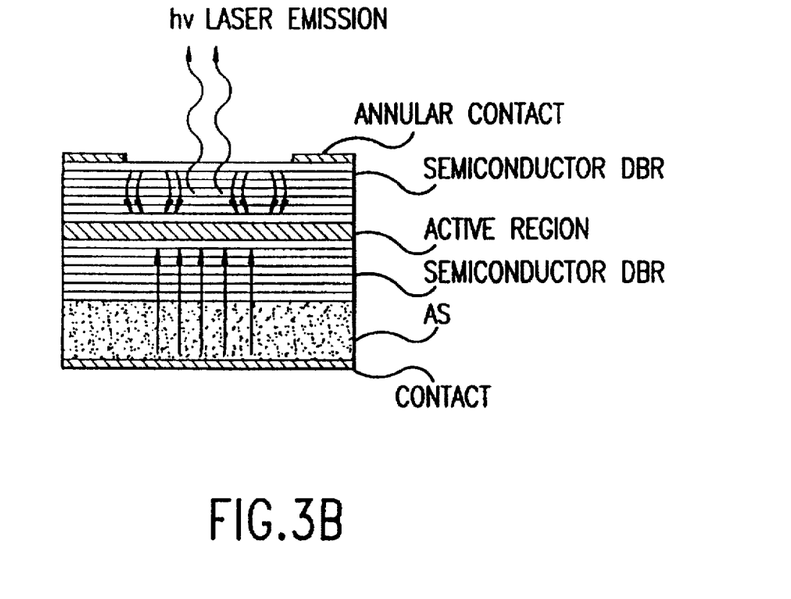

A TS VCSEL can employ a circular metal contact directly adjacent to the DBR semiconductor mirror stack. The TS, which serves as an escape medium for the laser emission, permits this device geometry. A "thick" (>100 µm) conductive (carrier concentration >$10^{16}$ cm$^{-3}$) ensures that the current can spread adequately from the contact on the TS side and simultaneously be injected directly above the emission area from an opaque solid (e.g., circular, square, etc.) contact placed directly upon the high resistance DBR layers (see FIG. 3a). This geometry is in contrast to that of an AS VCSEL wherein the single light escape path necessitates an annular contact adjacent to the high resistance DBR semiconductor mirror stack (see FIG. 3b). Typical emission areas are 1–40 µm for VCSELs. The TS circular contact geometry greatly reduces current crowding from the contact adjacent to the DBR stack, especially for large emission area devices. The current in the TS VCSEL device shown in FIG. 3a is therefore injected much more uniformly and efficiently into the lasing region. This in turn facilitates improvements in threshold current, threshold voltage, efficiency, single mode operation, etc.

Conventional VCSELs can be grown on a TS if the lattice constant of the epitaxially grown DBRs and the active layer designed for a given emission wavelength are lattice matched to the substrate, which is optically transparent to the active region's emission wavelength. Lattice matching is essential to prevent the creation of lattice defects which would impair the VCSEL's performance or reliability. Generally, the difference in lattice constants between the substrate and epitaxial active layers and semiconductor DBRs must be such that $|a-a_0|/a_0<10^{-3}$ where a is the lattice constant of each of the epitaxial layers and $a_0$ is the lattice constant of the growth substrate. For purposes of this invention, lattice matched layers are thus defined to be such that their lattice constants are $|a-a_0|/a_0<10^{-3}$. An exception are "thin" pseudomorphic layers whose thicknesses are below the critical thickness wherein lattice defects are generated due to lattice mismatch.

There are only a few active layer wavelengths/substrate band gap energy combinations which produce useful TS VCSELs through a lattice matched epitaxial growth process. These include 1.5 µm/InP, 1.3 µm/InP, and 980 nm/GaAs, all of which have been demonstrated. Unfortunately, such technologically important wavelengths as 780–880 nm and less than 690 nm are not candidates for this lattice matched epitaxial growth process, as no lattice matched TS is available.

Figure 5:
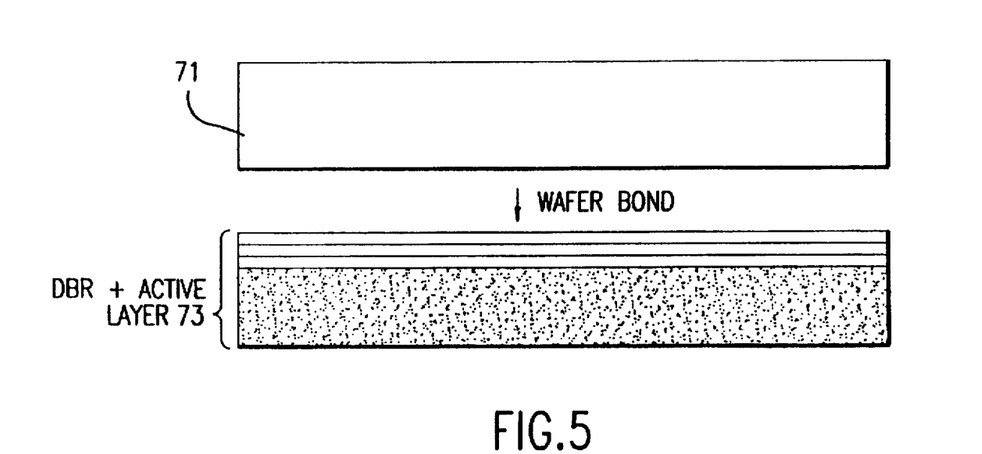
FIG. 5 illustrates the process used to fabricate the first embodiment of the present invention.

For those active layer wavelength/substrate band gap energy combinations for which a growth process cannot be used, a TS can replace the AS if compound semiconductor wafer bonding is used. This technique facilitates the growth of an entire VCSEL device (DBRs, active layer) of very high quality and the subsequent application of a lattice mismatched substrate without introducing harmful defects into the VCSEL active layer/DBR structure. FIG. 5 diagrams the process needed to make such a VCSEL. TS 71 is wafer bonded to upper DBR/active layer/lower DBR/AS combination 73. After wafer bonding, AS 73 can be selectively removed in any one of several ways, including etching, thus creating a VCSEL with a TS.

Figure 4:
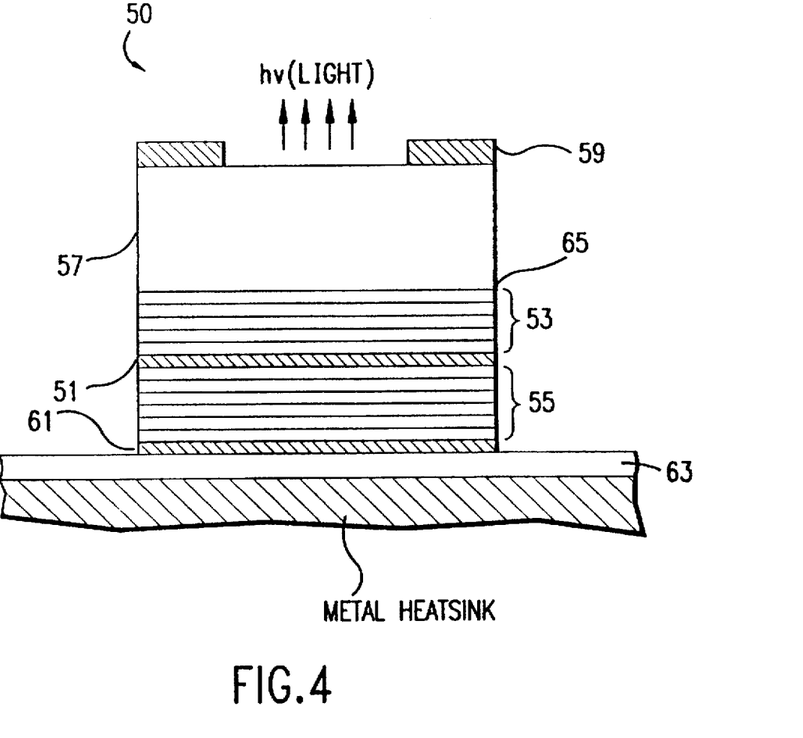
FIG. 4 is a cross sectional view of a first embodiment of the present invention.

A VCSEL fabricated according to the teachings of the present invention is shown in FIG. 4. TS VCSEL 50 is comprised of active layer 51, upper and lower lattice matched DBRs 53 and 55, respectively, a TS 57, ring contact metallization 59, lower contact metallization 61, and heat sink 63. Although each of these components is similar to those which make up VCSEL 10 (see FIG. 1), in VCSEL 50, TS 57 is wafer bonded to upper DBR 53, creating a wafer bonded interface 65. The distance from active layer 51 to heat sink 63 is no more than 5 µm, which greatly reduces the thermal resistance of the device, increasing the total heat removal rate from active layer 51 and DBRs 53 and 55 to heat sink 63.

The resulting VCSEL device exhibits low thermal resistance when mounted "junction down". The precise thermal resistance is a function of a variety of factors, including device geometry (e.g. device planarity, emission area, contact geometry, etc.), thickness, and the thermal resistivity of the individual layers in the device. Experimentally, the difference in thermal resistance for a conventional ~20 µm emission diameter 980 nm VCSELs with a pseudomorphic InGaAs active layer grown on a transparent GaAs substrate is ~5× higher when the device is mounted "junction up" compared to "junction down". In the wafer bonded TS VCSEL of the present invention, the wafer bonded TS devices should minimize the introduction of any additional thermal or electrical resistance, including that occurring at the wafer bond itself. The added thermal or electrical resistance should amount to less than a 50% increase over that of the 'original' device, when mounted "junction up". To maintain this behavior, the wafer bond must be coherent in the region directly above the emission area and comprise low thermal conductivity materials. Accordingly, when mounted "junction down", such a TS device will posses a thermal resistance lower than the original AS device. A device structure that satisfies these conditions will be defined as one capable of exhibiting low thermal resistance.

The resistivity of the wafer bond and/or TS may dictate two different device structures in the present invention. The first structure employs a conductive TS (carrier concentration $>10^{16}$ cm$^{-3}$) and a low resistance ohmic wafer bond (adding an additional series resistance less than that of 50% of the original non-bonded AS device structure). In this structure, contacts can be made directly to the TS, improving current spreading in the device structure. In a second wafer bonded TS VCSEL structure, either the wafer bond or substrate itself is sufficiently resistive (outside the aforementioned ranges) to prevent contacts being made to the TS. In this situation, electrical contacts to the active region closest to the TS may be made either to the underlying DBR or directly to one of the layers in the active region (intercavity contact).

The wafer bonding process may require a high temperature processing step. Such high temperatures or other manufacturing requirements may make it desirable to form additional reflective layers on either side of the TS, or within the original DBR. These layers may consist of layers of high and low refractive index semiconductor alloys and/or dielectrics. The materials on the TS need not be lattice matched to any of the layers and serve to increase the reflectivity of the DBR adjacent to the wafer bond. It may also be desirable to place intermediate layers on either side of the bonded interface to provide coherent and/or low resistance bonding (e.g., materials such that the mass transport rates of the materials on either side of interface are nearly the same (e.g., InP/InGaAs) or very different (e.g., SiO$_2$/GaAs)). It may also be desirable to pattern the outer surface of the TS into a lens, diffraction grating or similar structure. This can be performed before or after the wafer bonding and would serve to redirect or focus all or some of the light emitted by the VCSEL.

Figure 6A:
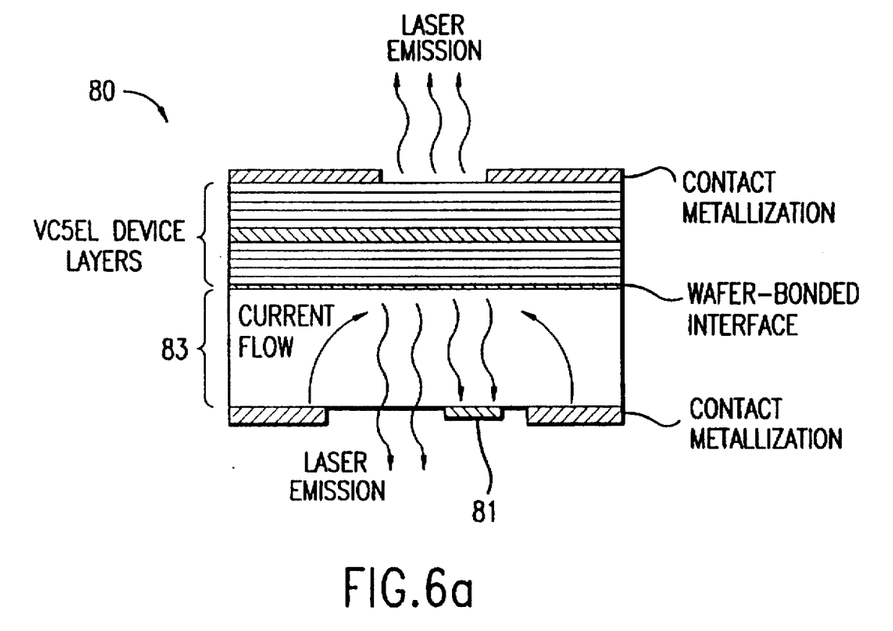
FIG. 6 shows embodiments of the present invention wherein a photodetector has been integrated with the VCSEL.
Figure 6B:
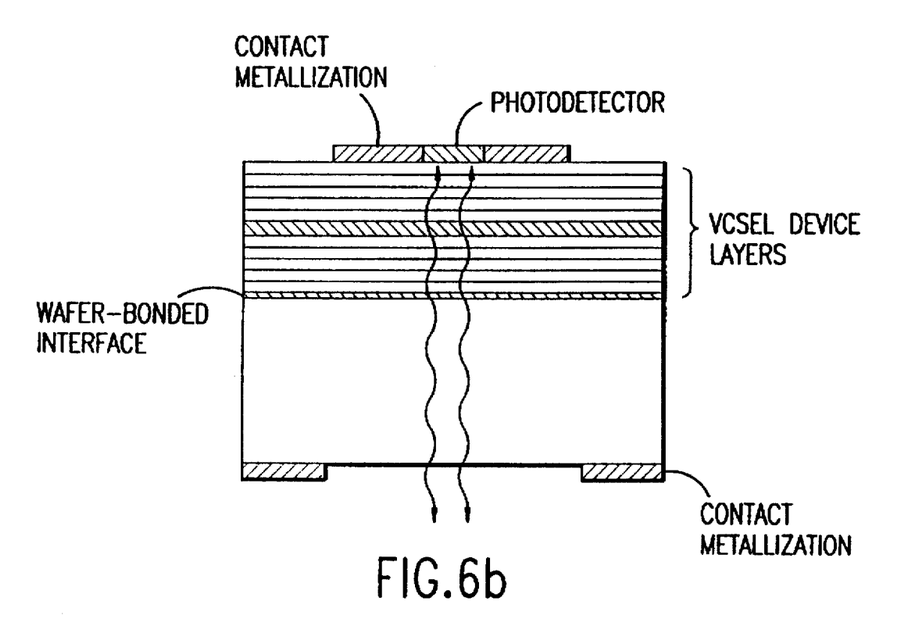
Figure 7:
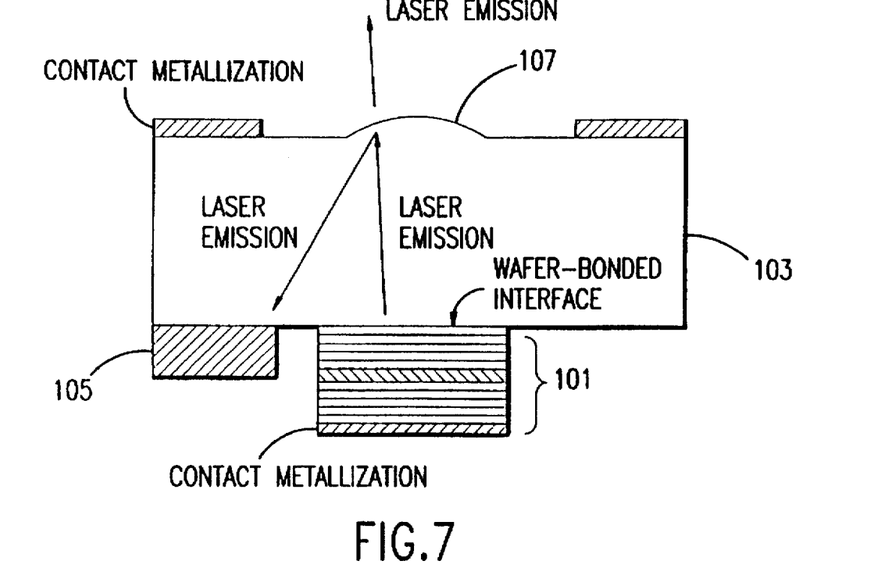
FIG. 7 is a variation of the embodiment shown in FIG. 5.

Wafer bonding may also be used in VCSEL devices to facilitate integration with other optoelectronic components. A wafer bonded TS facilitates this integration by providing two light output surfaces(whereas only one is provided in an AS device). As a result, the outer TS surface may have optoelectronic components mounted on it. These components may include photodetectors, phototransistors, optical modulators, etc. FIG. 6a is an example where photodetector 81 is mounted to TS 83 of wafer bonded VCSEL 80. Such an arrangement may be very desirable as the photodiode could be used to monitor and/or control the laser output of the VCSEL. In this configuration, the photodiode need not block all of the laser output of the VCSEL (e.g., the photodiode and laser emission may occur from the same side). In this case, the VCSEL may also be mounted "junction down", providing improved heat sinking. The photodetector may be mounted adjacent to the DBR stack as shown in FIG. 6b wherein the laser light is allowed to escape through the TS. A variety of mounting techniques can be employed to mount such optoelectronic components, including wafer bonding, solder bonding methods, etc. The optoelectronic component could potentially be integrated on the same side of the TS as the VCSEL. In this case, a patterned surface could serve to redirect light to the integrated component while still allowing laser emission to exit the TS. As shown in FIG. 7, VCSEL layers 101 are mounted on the lower surface of TS 103, along with photodetector 105. Lens-like surface 107 redirects a portion of the light emitted by VCSEL layers 101 to photodetector 105. This configuration has the advantage that the VCSEL can still be mounted "junction down", allowing simultaneous improved thermal performance.

Wafer bonding can also be used to electrically connect multiple VCSEL emitters to a common drive element. It is often desirable to electrically interconnect the p-side of VCSELs to a common voltage level ("p-common"), permitting the use of certain known electronic drive circuitry. In this case, the VCSEL structures should be grown on a low resistance p-type substrate. However, in practice, this is difficult due to higher defect densities sometimes encountered in p-type substrates and the tendency for the p-type dopant in the substrate to diffuse into the device layers, both of which degrade the device's performance. Using the teachings of the present invention, the VCSEL device layers are grown "p-side up" on an n-type or undoped substrate and then wafer bonded with a low resistance wafer bond to a conductive p-type substrate. The original growth substrate is then removed, resulting in a structure that can be fabricated into a p-common array of VCSELs while maintaining the integrity of the VCSEL device layers. In this embodiment, the substrate may be an AS or a TS. An analogous approach could also be employed for fabricating n-common arrays should n-type substrates pose a limiting factor for device growth.

An additional important consideration in VCSEL design is effecting current and/or optical confinement within the device. Achieving current confinement in close proximity to the active layer improves the device efficiency. However, this confinement is difficult to achieve as current is generally injected through the outermost layers of the DBRs which are removed from the active layer of the device. Confining the optical wave to the emission area parallel to the planes of the epitaxial layers is important to achieving overlap of the optical modes and gain profile (injected current distribution), and also facilitates lateral mode definition and reduces diffraction/scattering losses.

Patterned wafer bonding techniques can be applied to such VCSEL structures to improve the optical and/or current confinement within the VCSEL. These patterned regions should be such that they restrict current flow or exhibit a lower refractive index to effect current or optical confinement, respectively. For effective current confinement, the current blocking regions should be placed <2 μm from the active region and preferably <0.5 μm. The optical confining regions should be placed sufficiently close to the active layer to strongly interact with the optical field (<2 μm) and preferably <0.3 μm. Accordingly the patterned regions may be placed anywhere within the DBR, on either or both sides of the active layer. The current and optical confinement regions may be one in the same or distinctly different and may comprise more than one region.

Figure 8A:
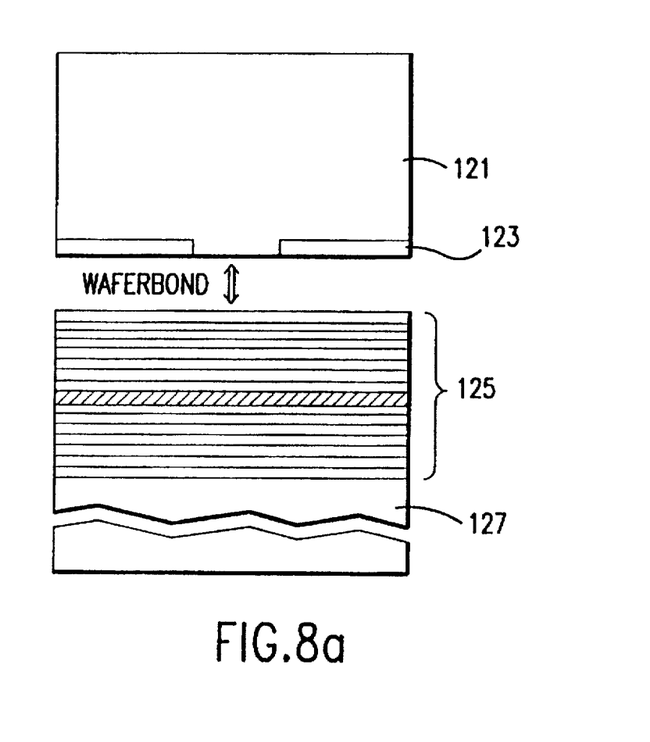
FIG. 8a illustrates the process used to fabricate VCSELs with patterned current blocking and/or optical confinement layers.
Figure 8B:
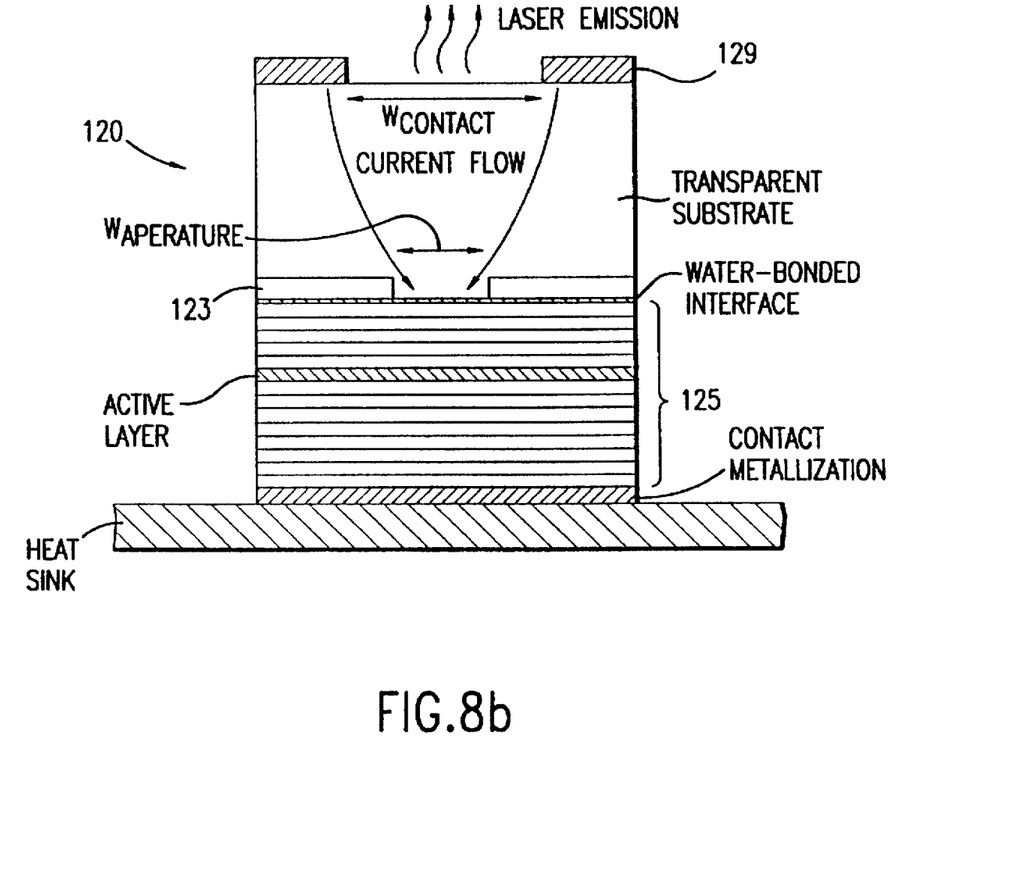
FIG. 8b illustrates a VCSEL with patterned current blocking and/or optical confinement layers.

As shown in FIG. 8a, TS substrate 121 with patterned current blocking and optical confining layers 123 is wafer bonded to VCSEL device layers 125. Thereafter, growth substrate 127 is selectively removed. The completed device 120 is shown in FIG. 8b. FIG. 8b also indicates how blocking layers 123 restrict current flow between VCSEL layers 125 and contact metallization 129.

Figure 8C:
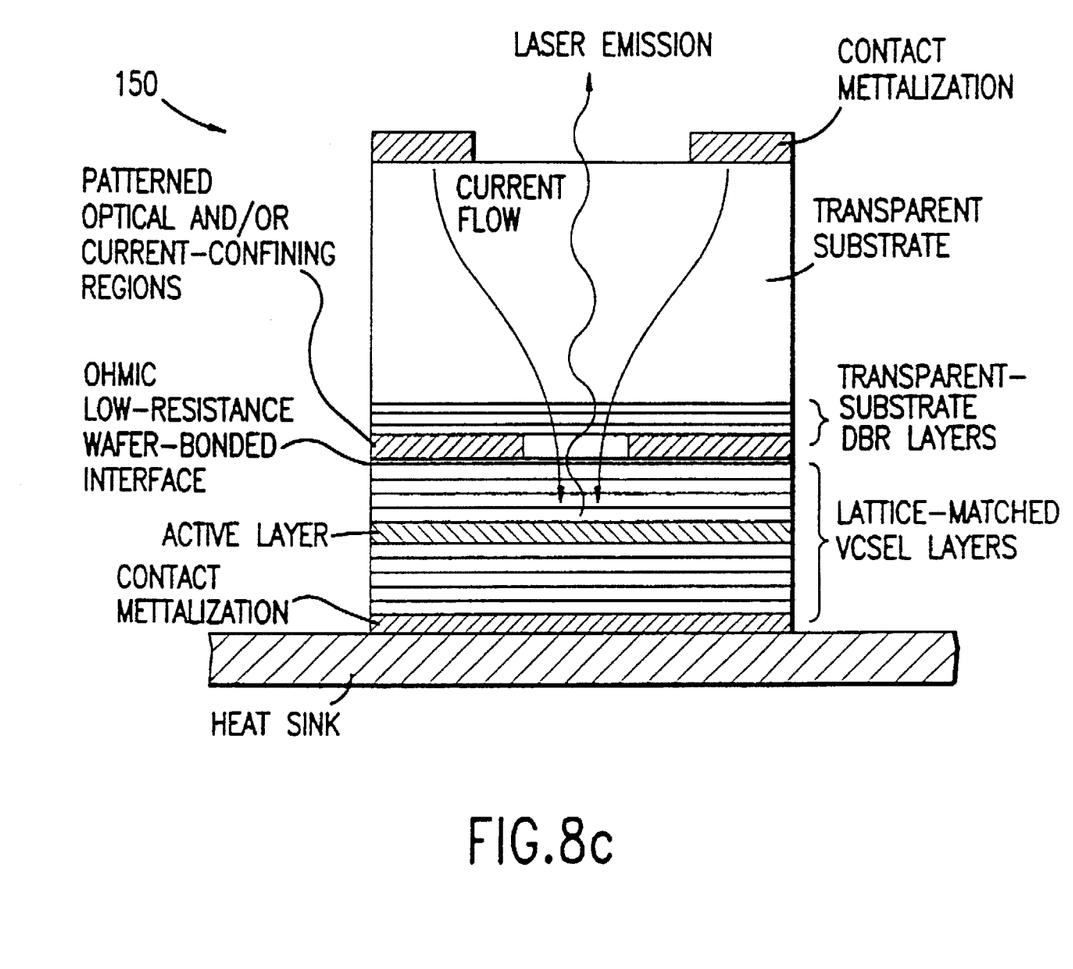
FIG. 8c illustrates a VCSEL with current blocking and/or optical confinement layers within the DBR.

The patterning may occur on either or both of the interfaces to be bonded. The patterned regions may be placed in closer proximity to the active layer by only growing part of the mirror stack required for the VCSEL on the VCSEL layers. The remainder of the mirror stack is then grown on the wafer bonded substrate. Either or both of the VCSEL mirrors or wafer bonded substrates may be patterned, resulting in embedding the patterned regions in close proximity to the active layer. VCSEL 150, shown in FIG. 8c, utilizes such embedded patterning. The close placement of optical/current confinement layers to the light emitting layers has facilitated the fabrication of very high performance VCSEL devices.

The only previously known way to realize these devices wherein the optical/current confinement is within close proximity to the active layer is to laterally grow an Al-bearing native oxide. See K. L. Lear, K. D. Choquette, R. P. Schneider, Jr., S. P. Kilcoyne, and K. M. Geib, "Selectively Oxidized Vertical Cavity Surface Emitting Lasers With 50% Power Conversion Efficiency," Electron. Lett., Vol. 31, pp. 208–209, 1995. Although this approach results in a high performance device, it has serious potential manufacturing/reliability problems. The method described herein provides an alternative means of providing optical and/or current confinement in very close proximity to the active region allowing high performance operation.

Although this description focuses on TS devices, its teachings may also be used with AS devices, wherein the bonded wafer is an AS. A variety of technologies may be employed to pattern optical confinement or resistive/current-blocking regions in the device, as indicated by the table below.

TABLE 1

| Technique | Potential Means of Current Confinement | Potential Means of Optical Confinement |
|---|---|---|
| Etching regions to form cavities outside emission region | Y | Y |
| Ion Implantation | Y | N (small effect) |
| Diffusion | Y | N (small effect) |
| Impurity Induced Layer Disordering | Y | Y |
| Etching and regrowth of blocking layers and/or heterojunctions | Y | Y |
| Etching and deposition of dielectric material | Y | Y |
| Oxidation of Al-bearing III-V semiconductor layer | Y | Y |

Table 2 lists several wavelengths and material systems utilizing the techniques and methods of this specification.

TABLE 2

| Wavelength | Lattice Matched TS Substrate | Active Layer | Potential |
|---|---|---|---|
| 780–880 nm | GaAs—AS | $Al_xGa_{1-x}As$ or GaAs | |
| <690 nm | GaAS—AS | $(Al_xGa_{1-x})_{0.5}In_{0.5}P$ | |
| GaP | | | |

VCSELs in the 780–880 nm range are useful in laser printer applications, while VCSELs in the less than 690 nm range are useful in plastic optical fiber communications. These material systems are only examples. Extensions to other material systems (e.g., Sb-based, N-based) are within the scope of the present invention.

Wafer bonding can also be used to improve current spreading from the ring contact on the TS side while using a solid contact adjacent to the DBR (see FIG. 3). Some materials used to fabricate DBRs in VCSELs can hamper current spreading into the center light emitting areas, especially in VCSELs with large spot sizes. Attaching a thick low resistance TS, and using a solid contact adjacent to the high resistance DBR, would permit more uniform current injection into the active region while allowing light to escape through the TS.

What is claimed is:

1. A vertical cavity surface emitting laser diode comprising:
   an active layer having an upper and lower surface;
   upper and lower reflectors on the upper and lower surfaces of the active layer and adjacent thereto;
   a transparent substrate wafer bonded to the upper distributed Bragg reflector; and
   contacts for applying a voltage across the active region.

2. The vertical cavity surface emitting laser diode of claim 1 wherein the diode exhibits low thermal resistance.

3. The vertical cavity surface emitting laser diode of claim 2 wherein a heat sink is attached to the vertical cavity surface emitting laser diode within 5 µm of the lower reflector.

4. The vertical cavity surface emitting laser diode of claim 2 wherein the active layer is less than 10 µm from the heat sink.

5. The vertical cavity surface emitting laser diode of claim 1 wherein the wafer bonded interface is ohmic and of low resistance, the transparent substrate is conductive, and at least a first contact is made directly to the transparent substrate.

6. The vertical cavity surface emitting laser diode of claim 5 wherein a second contact is made directly to the lower reflector, the second contact having a solid, non-annular geometric shape.

7. The vertical cavity surface emitting laser diode of claim 1 wherein patterned regions for optical confinement are placed within 2 µm of the wafer bond.

8. The vertical cavity surface emitting laser diode of claim 5 wherein patterned regions to effect one of optical and current confinement are placed within the diode structure no further than 2 µm from the wafer bond.

9. The vertical cavity surface emitting laser diode of claim 1 wherein additional reflective layers are placed between the transparent substrate and the wafer bonded interface.

10. The vertical cavity surface emitting laser diode of claim 9 wherein patterned regions to effect at least one of optical and current confinement are placed within the device structure no more than 2 µm from the wafer bond.

11. The vertical cavity surface emitting laser diode of claim 1 wherein at least a part of an exterior surface of the transparent substrate is shaped to redirect the light in a preferred direction.

12. The vertical cavity surface emitting laser diode of claim 1 wherein at least one additional optoelectronic component is mounted on an exposed surface of the vertical cavity surface emitting laser diode.

13. The vertical cavity surface emitting laser diode of claim 12 wherein the additional optoelectronic component is a photodetector.

14. The vertical cavity surface emitting laser diode of claim 10 wherein the mounting method comprises wafer bonding.

15. An array of vertical cavity surface emitting lasers comprised of a plurality of individual vertical cavity surface emitting lasers, each individual vertical cavity surface emitting laser comprising:
   a p-n junction active layer, a first exposed surface of the active layer comprising a p-type semiconductor and a second exposed surface of the active layer comprising an n-type semiconductor;

a p-type distributed Bragg reflector adjacent to and covering the exposed p-type semiconductor surface of the active layer and lattice matched to it; and an n-type distributed Bragg reflector adjacent to and covering the exposed n-type semiconductor surface of the active layer and lattice matched to it;

a single conductive substrate comprising one of n-type and p-type semiconductor, the single substrate being wafer bonded to the distributed Bragg reflectors of each individual vertical cavity surface emitting laser having the same semiconductor type as the substrate, the wafer bonded interface being ohmic and low resistance, permitting all the lasers to be electrically coupled to the same substrate.

16. A vertical cavity surface emitting laser diode comprising:

an active layer having an upper and lower surface;

upper and lower distributed Bragg reflectors on top and below the active layer and adjacent to the upper and lower surfaces;

a wafer bonded interface within at least one of the distributed Bragg reflectors;

contacts for applying a voltage across the active layer; and patterned regions within 2 μm of the wafer bond to effect one of optical and current confinement.

* * * * *